United States Patent
Nath et al.

(10) Patent No.: US 12,339,583 B2
(45) Date of Patent: Jun. 24, 2025

(54) OPTIMIZATION USING A NON-UNIFORM ILLUMINATION INTENSITY PROFILE

(71) Applicants: ASML HOLDING N.V., Veldhoven (NL); ASML NETHERLANDS B.V., Veldhoven (NL)

(72) Inventors: Janardan Nath, Norwalk, CT (US); Christopher John Mason, Newtown, CT (US); Duan-Fu Stephen Hsu, Fremont, CA (US); Todd R. Downey, Monroe, CT (US); Tian Gang, Best (NL)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 515 days.

(21) Appl. No.: 17/776,728

(22) PCT Filed: Nov. 18, 2020

(86) PCT No.: PCT/EP2020/082570
§ 371 (c)(1),
(2) Date: May 13, 2022

(87) PCT Pub. No.: WO2021/099408
PCT Pub. Date: May 27, 2021

(65) Prior Publication Data
US 2022/0390832 A1    Dec. 8, 2022

Related U.S. Application Data

(60) Provisional application No. 62/937,478, filed on Nov. 19, 2019.

(51) Int. Cl.
*G03F 1/70* (2012.01)
*G03F 1/36* (2012.01)

(52) U.S. Cl.
CPC . *G03F 1/70* (2013.01); *G03F 1/36* (2013.01)

(58) Field of Classification Search
CPC .................................. G03F 1/36; G03F 1/70
USPC ............................................................. 430/5
See application file for complete search history.

(56) References Cited

U.S. PATENT DOCUMENTS

| | | |
|---|---|---|
| 5,229,872 A | 7/1993 | Mumola |
| 6,046,792 A | 4/2000 | Van Der Werf et al. |
| 7,936,445 B2 | 5/2011 | Hintersteiner et al. |
| 8,663,881 B2 | 3/2014 | Buurman et al. |
| 9,588,438 B2 | 3/2017 | Hsu et al. |
| 2006/0057471 A1 | 3/2006 | Schenau et al. |
| 2006/0268248 A1 | 11/2006 | Noelscher |
| 2007/0031745 A1 | 2/2007 | Ye et al. |
| 2007/0050749 A1 | 3/2007 | Ye et al. |
| 2008/0129975 A1 | 6/2008 | Suda |
| 2008/0301620 A1 | 12/2008 | Ye et al. |
| 2008/0309897 A1 | 12/2008 | Wong et al. |
| 2009/0157630 A1 | 6/2009 | Yuan |
| 2010/0162197 A1 | 6/2010 | Ye et al. |
| 2010/0180251 A1 | 7/2010 | Ye et al. |
| 2016/0062244 A1 | 3/2016 | Patra |
| 2016/0246180 A1 | 8/2016 | Natt et al. |
| 2019/0113850 A1 | 4/2019 | Ma et al. |

FOREIGN PATENT DOCUMENTS

| | | |
|---|---|---|
| CN | 102540754 | 7/2012 |
| CN | 102890424 | 1/2013 |
| CN | 109725487 | 5/2019 |

OTHER PUBLICATIONS

International Search Report and Written Opinion issued in corresponding PCT Patent Application No. PCT/EP2020/082570, dated Feb. 26, 2021.
Spence, C.: "Full-Chip Lithography Simulation and Design Analysis—How OPC Is Changing IC Design", Proc. of SPIE, vol. 5751, pp. 1-14 (2005).
Office Action issued in corresponding Chinese Patent Application No. 202080080189, dated Apr. 18, 2025.

*Primary Examiner* — Christopher G Young
(74) *Attorney, Agent, or Firm* — Pillsbury Winthrop Shaw Pittman, LLP

(57) ABSTRACT

A method for source mask optimization or mask only optimization used to image a pattern onto a substrate. The method includes determining a non-uniform illumination intensity profile for illumination; and determining one or more adjustments for the pattern based on the non-uniform illumination intensity profile until a determination that features patterned onto a substrate substantially match a target design. The non-uniform illumination intensity profile may be determined based on an illumination optical system and projection optics of a lithographic apparatus. In some embodiments, the lithographic apparatus includes a slit, and the non-uniform illumination profile is a through slit non-uniform illumination intensity profile. Determining the one or more adjustments for the pattern may include performing optical proximity correction, for example.

20 Claims, 11 Drawing Sheets

OPTIMIZATION USING A NON-UNIFORM ILLUMINATION INTENSITY PROFILE

CROSS-REFERENCE TO RELATED APPLICATIONS

This application is the U.S. national phase entry of PCT Patent Application No. PCT/EP2020/082570, which was filed on Nov. 18, 2020, which claims priority the benefit of U.S. Provisional Patent Application No. 62/937,478, which was filed on Nov. 19, 2019 and which is incorporated herein in its entirety by reference.

TECHNICAL FIELD

The present description relates to using a non-uniform illumination intensity profile for source mask or mask only optimization methods associated with imaging a pattern onto a substrate.

BACKGROUND

A lithographic projection apparatus can be used, for example, in the manufacture of integrated circuits (ICs). A patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate includes a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), and the reduction ratio can be different in x and y direction features the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

SUMMARY

According to an embodiment, there is provided an optimization method associated with imaging a pattern. The method comprises determining a non-uniform illumination intensity profile for illumination from an illumination source; and adjusting the pattern based on the non-uniform illumination intensity profile until a termination condition is satisfied.

In an embodiment, the determining and the adjusting are performed as part of source mask optimization or mask only optimization.

In an embodiment, the non-uniform illumination intensity profile is determined based on a population of empirical data and/or a corresponding electronic model.

In an embodiment, the method is for a lithographic apparatus. The lithographic apparatus comprises the illumination source and projection optics configured to image the pattern onto a substrate. The non-uniform illumination intensity profile is determined based on the illumination source and the projection optics. The method comprises determining one or more adjustments for one or more of the pattern, the projection optics, or the illumination source based on the non-uniform illumination intensity profile until the termination condition is satisfied.

In an embodiment, the projection optics comprise a slit, and the non-uniform illumination intensity profile is a through slit non-uniform illumination intensity profile.

In an embodiment, the projection optics comprise a pupil, and determining the one or more adjustments for one or more of the pattern, the projection optics, or the illumination source comprises determining an adjustment for a through slit pupil.

In an embodiment, determining the one or more adjustments for one or more of the pattern, the projection optics, or the illumination source comprises determining a through slit apodization.

In an embodiment, determining the one or more adjustments for one or more of the pattern, the projection optics, or the illumination source comprises performing optical proximity correction.

In an embodiment, performing optical proximity correction comprises applying one or more rule or model based assist features, and modeling a process for imaging the pattern onto the substrate.

In an embodiment, a model comprises a through slit optical proximity correction model configured to model the process for imaging the pattern onto the substrate using the non-uniform illumination intensity profile.

In an embodiment, the through slit optical proximity correction model is configured to model the process for imaging the pattern onto the substrate using the non-uniform illumination intensity profile and different doses from the illumination source.

In an embodiment, the method comprises adjusting for drift in the non-uniform illumination intensity profile; and determining the one or more adjustments for one or more of the pattern, the projection optics, or the illumination source based on a drift-adjusted non-uniform illumination intensity profile until the termination condition is satisfied.

In an embodiment, adjusting for drift comprises positioning one or more beam interceptors in one or more locations in a path of the illumination from the illumination source to intercept one or more corresponding portions of the illumination in the one or more locations.

In an embodiment, the one or more beam interceptors comprise one or more opaque finger members.

In an embodiment, adjusting for drift comprises modeling a positioning of one or more beam interceptors in one or more locations in a path of the illumination from the illumination source to intercept one or more corresponding portions of the illumination in the one or more locations.

In an embodiment, the drift is caused by one or both of projection optics collector contamination and illumination source tolerances.

In an embodiment, determining the one or more adjustments for one or more of the pattern, the projection optics, or the illumination source based on the non-uniform illumination intensity profile is configured to reduce high frequency non-uniformity in the illumination from the illumination source relative to illumination from the illumination source having a substantially uniform illumination intensity profile.

In an embodiment, the projection optics comprise a dipole-x pupil, and wherein determining the one or more adjustments for one or more of the pattern, the projection optics, or the illumination source comprises determining an adjustment for a through slit dipole-x pupil.

In an embodiment, determining the non-uniform illumination intensity profile and determining the one or more adjustments for one or more of the pattern, the projection optics, or the illumination source are performed for a semiconductor manufacturing process.

In an embodiment, the non-uniform illumination intensity profile is used for a pupil and mask co-optimization step of source mask optimization or mask only optimization for the semiconductor manufacturing process.

In an embodiment, the pattern comprises a mask pattern.

In an embodiment, the termination condition comprises a determination that features patterned onto the substrate substantially match a target design.

In an embodiment, a non-transitory computer readable medium having instructions thereon is provided. The instructions, when executed by a computer, implementing the method of any of the embodiments described above.

According to another embodiment, a non-transitory computer readable medium having instructions thereon is provided. The instructions, when executed by a computer, causing the computer to: determine a non-uniform illumination intensity profile for illumination from an illumination source; and adjust the pattern based on the non-uniform illumination intensity profile until a termination condition is satisfied.

In an embodiment, the determining and adjusting are performed as part of a source mask optimization or mask only optimization.

In an embodiment, the non-uniform illumination intensity profile is determined based on a population of empirical data and/or a corresponding electronic model.

In an embodiment, the determining and adjusting are performed for a lithographic apparatus. The lithographic apparatus comprises the illumination source and projection optics configured to image the pattern onto a substrate.

In an embodiment, the non-uniform illumination intensity profile is determined based on the illumination source and the projection optics. The instructions are further configured to cause the computer to determine one or more adjustments for one or more of the pattern, the projection optics, or the illumination source based on the non-uniform illumination intensity profile until the termination condition is satisfied.

In an embodiment, the projection optics comprise a slit, and the non-uniform illumination profile is a through slit non-uniform illumination intensity profile.

In an embodiment, the projection optics comprise a pupil, and determining the one or more adjustments for one or more of the pattern, the projection optics, or the illumination source comprises determining an adjustment for a through slit pupil.

In an embodiment, determining the one or more adjustments for one or more of the pattern, the projection optics, or the illumination source comprises determining a through slit apodization.

In an embodiment, determining the one or more adjustments for one or more of the pattern, the projection optics, or the illumination source comprises performing optical proximity correction.

In an embodiment, performing optical proximity correction comprises applying one or more rule or model based assist features, and modeling a process for imaging the pattern onto the substrate.

In an embodiment, a model comprises a through slit optical proximity correction model configured to model the process for imaging the pattern onto the substrate using the non-uniform illumination intensity profile.

In an embodiment, the through slit optical proximity correction model is configured to model the process for imaging the pattern onto the substrate using the non-uniform illumination intensity profile and different doses from the illumination source.

According to another embodiment, an optimization method associated with imaging a pattern is provided. The method comprises determining a non-uniform illumination intensity profile for illumination from an illumination source; adjusting the pattern based on the non-uniform illumination intensity profile until a termination condition is satisfied; and imaging the adjusted pattern onto a substrate.

According to another embodiment, a lithography apparatus is provided. The apparatus comprises an illumination source and projection optics configured to image a pattern onto a substrate; and one or more processors configured by machine readable instructions to: determine a non-uniform illumination intensity profile for illumination from the illumination source, the non-uniform illumination intensity profile determined based on the illumination source and the projection optics; and adjust the pattern based on the non-uniform illumination intensity profile until a termination condition is satisfied.

DETAILED DESCRIPTION

Figure 1:
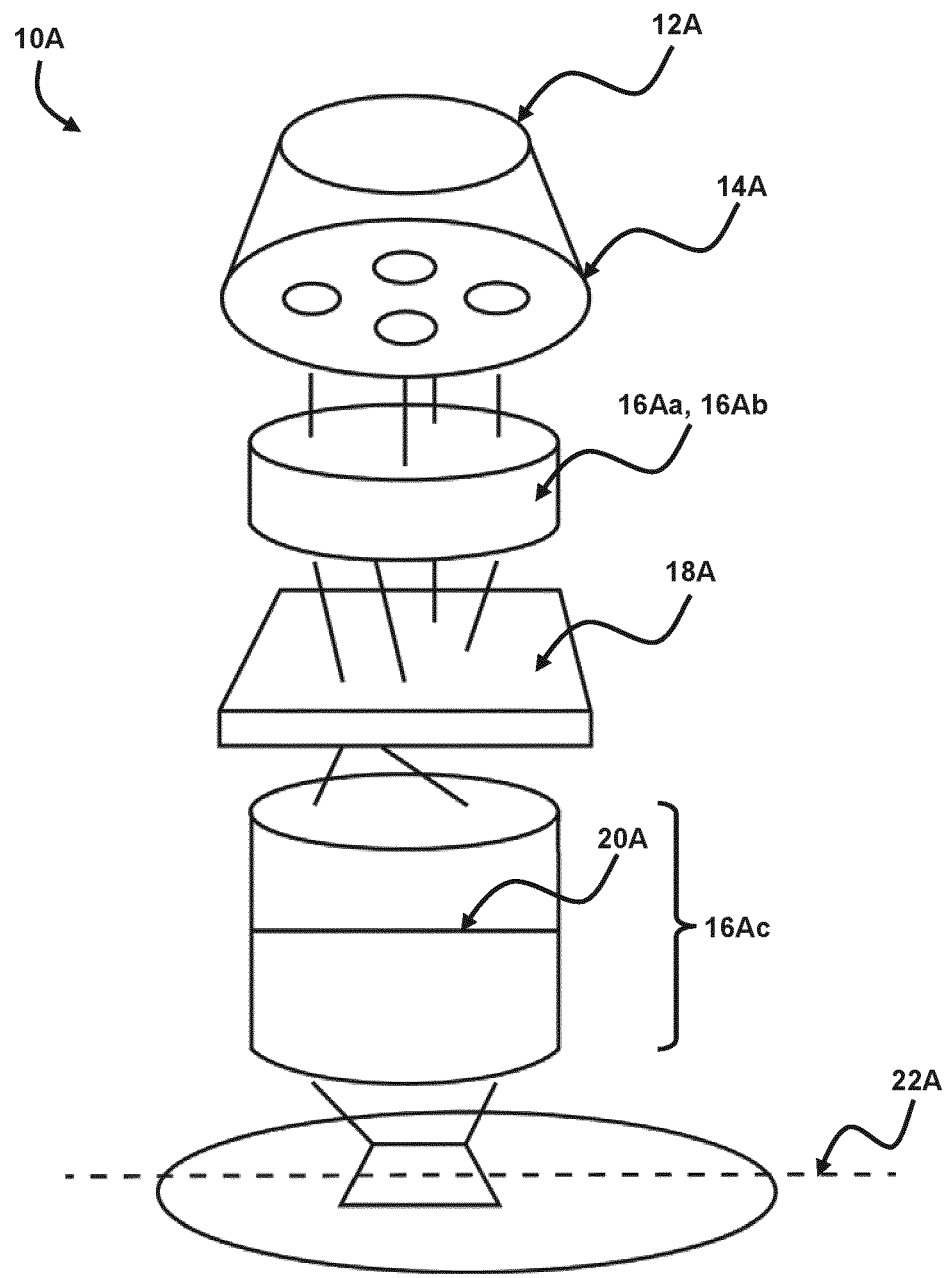
FIG. 1 shows a block diagram of various subsystems of a lithography system.

Typical source mask, or mask only, optimization operations (e.g., optical proximity correction, source mask co-optimization operations, etc.) assume a flat and/or otherwise uniform illumination intensity profile to represent illumination from an illumination source. Typical optimization operations (e.g., optical proximity correction) do not account for the effects of beam intercepting (e.g., Uniformity Compensator or Unicom) finger members. In actual practice, these finger members are used to correct (or flatten) a non-uniform illumination intensity profile for illumination from an illumination source passing through an open slit (in a lithographic apparatus). These finger members produce the flat and/or otherwise uniform corrected illumination intensity profile used (assumed) for typical optical proximity correction, for example. However, these finger members induce high frequency non-uniformity (HF) in the corrected illumination intensity profile. The high frequency non-uniformity may be enhanced for a pupil distribution such as a dipole-x pupil distribution (DX), with two lobes in a non-scan direction which correspond to a finger pitch and/or fingertip geometry of the fingers. The DX pupil has an increased high frequency non-uniformity (e.g., relative to other pupil configurations) because the pitch of the finger members matches the distance between the lobes of the pupil in a typical process. This high frequency non-uniformity negatively impacts the imaging performance of a lithographic apparatus and is not accounted for by typical optimization operations including optical proximity correction (e.g., because the flat and/or otherwise uniform corrected profile described above is simply assumed). In fact, there is currently no existing solution to mitigate the impact of the high frequency non-uniformity in (e.g., NXE 3x00 or EXE 5000) EUV lithographic apparatuses, for example.

The present method uses a non-uniform open slit illumination intensity profile as input for source mask, or mask only, optimization operations (e.g., such as optical proximity correction) and/or other operations. The present method also includes beam intercepting finger member (e.g., Unicom) corrected profiles as one of the inputs or constraints in the optimization operations (e.g., in optical proximity correction). This method enhances imaging performance of lithographic apparatuses compared to prior art systems. This method may be beneficial for pupil settings such as dipole-x (DX), which is associated with high gradients at the edges of an open-slit, for example, and other pupil settings. For example, the slope of the uncorrected (open slit) has the largest absolute value near the edges of the slit. Although such gradients can be corrected using the beam intercepting finger members (e.g., Unicom 4 mm pitch fingers), high frequency residue still remains in a typical corrected (e.g., flattened) profile. Advantageously, the present method is configured to account for this high frequency residue. In addition, the open-slit non-uniform illumination intensity profile used in the present method remains substantially consistent from lithographic apparatus to lithographic apparatus (e.g., scanner to scanner), with only a relatively small amount of variation over time (e.g., such as drift in an open-slit because of collector contamination, illuminator tolerances, etc.)

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

A patterning device can comprise, or can form, one or more design layouts. The design layout can be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As a brief introduction, FIG. 1 illustrates an exemplary lithographic projection apparatus 10A. Major components are a radiation source 12A, which may be a deep-ultraviolet (DUV) excimer laser source or other type of source including an extreme ultra violet (EUV) source (as discussed above, the lithographic projection apparatus itself need not have the radiation source), illumination optics which, for example, define the partial coherence (denoted as sigma) and which may include optics 14A, 16Aa and 16Ab that shape radiation from radiation source 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin ($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
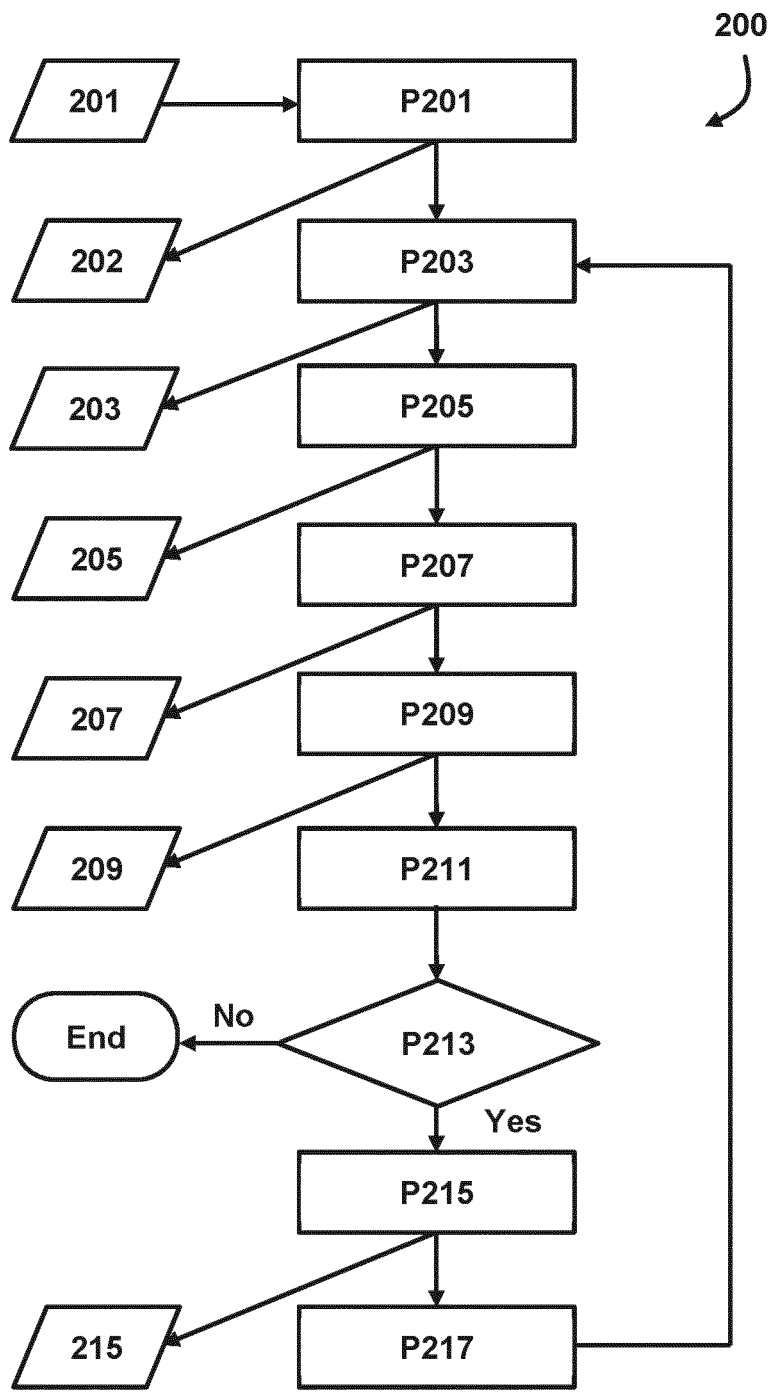
FIG. 2 is flow chart of a method for determining a patterning device pattern or a target pattern to be printed on a substrate, according to an embodiment.

FIG. 2 is flow chart of a method 200 for determining a patterning device pattern (or mask pattern, hereinafter) from an image (e.g., continuous transmission mask image, a binary mask image, a curvilinear mask image, etc.) corresponding to a target pattern to be printed on a substrate via a patterning process involving a lithographic process. In an embodiment, the design layout or the target pattern may be a binary design layout, a continuous tone design layout, or a design layout of another suitable form.

The method 200 is an iterative process, where an initial image (e.g., enhanced image, mask variables initialized from a CTM image, etc.) is progressively modified to generate different types of images according to different processes of the present disclosure to eventually generate information comprising mask patterns or an image (e.g., a mask variables corresponding to a final curvilinear mask) further used to fabricate/manufacture a mask. The iterative modification of the initial image may be based on a cost function, where during an iteration the initial image may be modified such that the cost function is reduced, in an embodiment, minimized. In an embodiment, the method 200 may also be referred to as a BINARIZED CTM process, where an initial image is an optimized CTM image which is further processed according to the present disclosure to generate a curvilinear mask patterns (e.g., geometry or polygonal representation shapes of a curvilinear mask or curvilinear pattern). In an embodiment, the initial image may be the enhanced image of the CTM image). The curvilinear mask patterns may be in the form of a vector, a table, mathematical equations, or other forms of representing geometric/polygonal shapes.

In an embodiment, process P201 may involve obtaining an initial image (e.g., a CTM image or an optimized CTM image, or a binary mask image). In an embodiment, initial image 201 may be a CTM image generated by a CTM generation process based on a target pattern to be printed on a substrate. The CTM image may then be received by the process P201. In an embodiment, the process P201 may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model (e.g., Tachyon model) is applied to obtain optical or resist images and cost functions are computed. The cost computation then gives the gradient values that are used in the optimization solver to update variables (e.g., pixel intensities). After several iterations during optimization, a final mask image is generated, which is further used as guidance map for pattern extraction (e.g., as implemented in Tachyon SMO software). Such an initial image (e.g., the CTM image) may include one or more features (e.g., a feature of a target pattern, SRAFs, SRIFs, etc.) corresponding to the target pattern to be printed on the substrate via the patterning process.

In an embodiment, the CTM image (or an enhanced version of the CTM image) may be used to initialize the mask variables that can be used as the initial image 201, which is iteratively modified as discussed below.

The process P201 may involve generating an enhanced image 202 based on the initial image 201. An enhanced image 202 may be an image where certain selected pixels within the initial image 201 are amplified. The selected pixels may be pixels having relatively lower values (or weak signals) within the initial image 201. In an embodiment, the selected pixels be pixels have signal values lower than, for example, an average intensity of pixels throughout the initial image, or a given threshold value. In other words, pixels with weaker signals within the initial image 201 are amplified, thus enhancing one or more features within the initial image 201. For example, a second order SRAFs around a target feature may have a weak signal that may be amplified. Thus, the enhanced image 202 may highlight or identify additional features (or structures) that may be included within a mask image (generated later on in the method). In a conventional method (e.g., CTM method) of determining a mask image, weak signals within an initial image may be ignored and as such, the mask image may not include features that may be formed from a weak signal in an initial image 201.

The generation of the enhanced image 202 involves applying an image processing operation such as a filter (e.g., an edge detection filter) to amplify weak signals within the initial image 201. Alternatively or in addition, the image processing operation may be deblurring, averaging, and/or feature extraction or other similar operations. Examples of the edge detection filter include the Prewitt operator, Laplacian operator, Laplacian of Gaussian (LoG) filter, etc. The generation step may further involve combining the amplified signals of the initial image 201 with original signals of the initial image 201 with or without modifying the original strong signals of the initial image 201. For example, in an embodiment, for one or more pixel values at one or more locations (e.g., at contact holes) across the initial image 201, the original signal may be relatively strong (e.g., above a certain threshold such as 150 or below −50), then the original signal at the one or more locations (e.g., at contact holes) may not be modified or combined with the amplified signal for that location.

In an embodiment, noise (e.g., random variation in brightness or color or pixel values) in the initial image 201 may also be amplified. So, alternatively or in addition, a smoothing process may be applied to reduce noise (e.g., random variation in brightness or color or pixel values) in the combined image. Examples of image smoothing methods include Gaussian blur, running average, low-pass filters, etc.

In an embodiment, the enhanced image 202 may be generated using an edge detection filter. For example, an edge detection filter may be applied to the initial image 201 to generate a filtered image that highlights edges of one or more features within an initial image 201. The resulting filtered image may be further combined with the original image (i.e., the initial image 201) to generate the enhanced image 202. In an embodiment, the combining of the initial image 201 and the image obtained after edge filtering may involve modifying only those parts of the initial image 201 that have weak signals without modifying the regions having strong signals, and the combining process could be weighted based on signal strength. In an embodiment, amplifying of the weak signal may also amplify noise within the filtered image. Hence, according to an embodiment, a smoothing process may be performed on the combined image. A smoothing of an image may refer to an approximating function that attempts to capture important patterns (e.g., target pattern, SRAFs) in the image, while leaving out noise or other fine-scale structures/rapid phenomena. In smoothing, the data points of a signal may be modified so individual points (presumably because of noise) may be reduced, and points that may be lower than the adjacent points may be increased leading to a smoother signal or a smoother image. Thus, upon smoothing operation, the further smooth version of the enhanced image 202 having reduced noise may be obtained, according to an embodiment of the present disclosure.

The method, in process P203 may involve generating mask variables 203 based on the enhanced image 202. In a first iteration, the enhanced image 202 may be used to initialize the mask variables 203. In later iterations the mask variables 203 may be updated iteratively.

A contour extraction of a real-valued function $f$ of n real variables, is a set of the form:

$$L_c(f)=\{(x_1, x_2, \ldots x_n)|f(x_1, x_2, \ldots x_n)=c\}$$

In a two dimensional space, the set defines the points on the surface at which the function $f$ equals to given value c. In a two dimensional space, the function $f$ is able to extract a closed contour which will be rendered to the mask image.

In the above equation, $x_1, x_2, \ldots x_n$ refer to mask variables such as the intensity of an individual pixel, which determines the locations where the curvilinear mask edge exists with a given constant value c (e.g. a threshold plane as discussed in process P205 below).

In an embodiment, at an iteration, the generating of the mask variables 203 may involve modifying one or more values of variables (e.g., pixel values at one or more locations) within the enhanced image 202 based on, for example, initialization conditions or a gradient map (which may be generated later on in the method). For example, the one or more pixel values may be increased or decreased. In other words, the amplitude of one or more signals within the enhanced image 202 may be increased or decreased. A modified amplitude of the signals may enable generation of different curvilinear patterns depending on an amount of change in the amplitude of the signal. Thus, the curvilinear patterns gradually evolve until a cost function is reduced, in an embodiment, minimized. In an embodiment, further smoothing may be performed on the level mask variables 203.

Furthermore, process P205 involves generating curvilinear mask patterns 205 (e.g., having polygon shapes represented in a vector form) based on the mask variables 203. The generation of the curvilinear mask patterns 205 may involve thresholding of the mask variables 203 to trace or generate curvilinear (or curved) patterns from the mask variables 203. For example, thresholding may be performed using a threshold plane (e.g., an x-y plane) having a fixed value which intersects the signals of the mask variables 203. The intersection of the threshold plane with the signals of the mask variables 203 generate tracings or outlines (i.e., curved polygon shapes) which form polygonal shapes that serve as the curvilinear patterns for the curvilinear mask patterns 205. For example, the mask variables 203 may be intersected with the zero plane parallel to the (x,y) plane. Thus, the curvilinear mask patterns 205 may be any curvilinear patterns generated as above. In an embodiment, the curvilinear patterns traced or generated from the mask variables 203 depend on the signals of the enhanced image 202. As such, the image enhancement process P203 facilitates improvement in patterns generated for a final curvilinear mask patterns. The final curvilinear mask patterns may be further used by a mask manufacturer to fabricate a mask for use in a lithography process.

Process P207 may involve rendering the curvilinear mask patterns 205 to generate a mask image 207. Rendering is an operation performed on the curvilinear mask patterns, which is a similar process as converting rectangle mask polygons into discrete grayscale image representations. Such a process could be generally understood as sampling the box function of continuous coordinates (polygons) into values at each point of image pixels.

The method further involves a forward simulation of the patterning process using process models that generate or predict a pattern that may be printed on a substrate based on the mask image 207. For example, process P209 may involve executing and/or simulating the process model using the mask image 207 as input and generating a process image 209 on the substrate (e.g., an aerial image, a resist image, etch image, etc.). In an embodiment, the process model may include a mask transmission model coupled to an optics model which is further coupled to a resist model and/or etch model. The output of the process model may be a process image 209 that has factored in different process variations during the simulation process. The process image may be further used to determine parameters (e.g., EPE, CD, overlay, sidelobe, etc.) of the patterning process by, for example, tracing the contours of the patterns within the process image. The parameters may be further used to define a cost function, which is further used to optimize the mask image 207 such that the cost function is reduced, or in an embodiment minimized.

In process P211, a cost function may be evaluated based on the process image 209 (also referred as a simulated substrate image or substrate image or wafer image). Thus, the cost function may be considered as process aware, where variations of the patterning process, enabling generation of curvilinear mask patterns that account for variations in patterning process. For example, the cost function may be an edge placement error (EPE), sidelobe, a mean squared error (MSE), Pattern placement error(PPE), normalized image log or other appropriate variable defined based on the contour of the patterns in the process image. An EPE may be an edge placement error associated with one or more patterns and/or a summation of all the edge placement errors related to all the patterns of the process model image 209 and the corresponding target patterns. In an embodiment, the cost function may include more than one condition that may be simultaneously reduced or minimized. For example, in addition to the MRC violation probability, the number of defects, EPE, overlay, CD or other parameter may be included and all the conditions may be simultaneously reduced (or minimized).

Furthermore, one or more gradient maps may be generated based on the cost function (e.g., EPE) and mask variables may be modified based on such gradient map(s). Mask variables (MV) refer to intensities of Ø. Accordingly, the gradient computation may be represented as dEPE/dØ, and the gradient values are updated by capturing the inverse mathematical relationship from the mask image (MI) to curvilinear mask polygons to mask variables. Thus, a chain of derivatives may be computed of the cost function with respect to the mask image, from the mask image to curvilinear mask polygon, and from curvilinear mask polygon to mask variables, which allows modification of the values of the mask variables at the mask variables.

In an embodiment, image regularization may be added to reduce the complexity of the mask patterns that may be generated. Such image regularization may be mask rule checks (MRC). MRC refers to the limiting conditions of a mask manufacturing process or apparatus. Thus, the cost function may include different components, for example, based on EPE and MRC violation penalty. A penalty may be a term of the cost function that depends on a violation amount, e.g., a difference between a mask measurement and a given MRC or mask parameter (for example, a mask pattern width and an allowed (e.g., minimum or maximum) mask pattern width). Thus, according to an embodiment of the present disclosure, mask patterns may be designed and a corresponding mask may be fabricated not only based on forward simulation of the patterning process, but also additionally based on manufacturing limitations of the mask manufacturing apparatus/process. Thus, a manufacturable curvilinear mask producing high yield (i.e., minimum defects) and high accuracy in terms of, for example, EPE or overlay on the printed pattern may be obtained.

The pattern corresponding to a process image should be exactly the same as the target pattern, however, such exact target patterns may not feasible (for example, typically sharp corners) and some conflictions are introduced due to the variations in the patterning process itself and/or approximations in the models of the patterning process. In a first iteration of the method, the mask image 207 may not generate a pattern (in the resist image) which is similar to the target pattern. The determination of accuracy or acceptance of the printed pattern in the resist image (or etch image) may be based on the cost function such as EPE. For example, if the EPE of the resist pattern is high, it indicates that the printed pattern using the mask image 207 is not acceptable and patterns in the mask variable 203 must be modified.

To determine whether a mask image 207 is acceptable, process P213 may involve determining whether the cost function is reduced or minimized, or whether a given iteration number is reached. For example, an EPE value of a previous iteration may be compared with an EPE value of the current iteration to determine whether the EPE has reduced, minimized, or converged (i.e., no substantial improvement in printed pattern is observed). When the cost function is minimized, the method may stop and the curvilinear mask patterns information that is generated is considered as an optimized result.

However, if the cost function is not reduced or minimized, and the mask related variables or enhanced image related variable (e.g., pixel values) may be updated. In an embodiment, the updating may be based on gradient-based method. For example, if the cost function is not reduced, the method 200 proceeds to a next iteration of generating the mask image after performing processes P215 and P217 that indicate how to further modify the mask variables 203

The process P215 may involve generating a gradient map 215 based on the cost function. The gradient map may be a derivative and/or a partial derivative of the cost function. In an embodiment the partial derivative of the cost function may be determined with respect pixels of the mask image and derivative may be further chained to determine partial derivative with respect to the mask variables 203. Such gradient computation may involve determining inverse relationships between the mask image 207 to the mask variables 203. Furthermore, an inverse relationship of any smoothing operation (or function) performed in process P205 and P203 must be considered.

The gradient map 215 may provide a recommendation about increasing or decreasing the values of the mask variables in a manner such that value of the cost function is reduced, in an embodiment, minimized. In an embodiment, an optimization algorithm may be applied to the gradient map 215 to determine the mask variable values. In an embodiment, an optimization solver may be used to perform gradient-based computation (in process P217).

In an embodiment, for an iteration, mask variables may be changed while the threshold plane may remain fixed or unchanged in order to gradually reduce or minimize the cost function. Thus, the curvilinear patterns generated may gradually evolve during an iteration such that the cost function is reduced, or in an embodiment, minimized. In another embodiment, mask variables as well as the threshold plane may both change to achieve faster convergence of the optimization process. Upon several iterations and/or minimization of the cost function may result in final set of BINARIZED CTM results (i.e., a modified version of the enhanced image, mask image, or curvilinear mask).

In an embodiment of the present disclosure, the transition from CTM optimization with grayscale image to BINARIZED CTM optimization with curvilinear mask may be simplified by replacing the thresholding process (i.e. P203 and P205) by a different process where a sigmoid transformation is applied to the enhanced image 202 and corresponding change in gradient computation is performed. The sigmoid transformation of the enhanced image 202 generates a transformed image that gradually evolve into a curvilinear pattern during an optimization process (e.g., minimizing cost function). During an iteration or a step of optimization, variables (e.g., steepness and/or a threshold) related to sigmoid function may be modified based on the gradient computation. As the sigmoid transformation becomes sharper (e.g., increase in steepness of the slope of the sigmoid transformation) in successive iterations, a gradual transition from the CTM image to a final BINARIZED CTM image may be achieved allowing improved results in the final BINARIZED CTM optimization with curvilinear mask patterns.

In an embodiment of the present disclosure, additional steps/process may be inserted into the loop of an iteration of the optimization, to enforce the result to have selected or desired properties. For example, smoothness may be ensured by adding a smoothing step, or other filter may be used to enforce image to favor horizontal/vertical structures.

As lithography nodes keep shrinking, more and more complicated masks are required. The present method may be used in key layers with DUV scanners, EUV scanners, and/or other scanners. The method according to the present disclosure may be included in different aspect of the mask optimization process including source mask optimization (SMO), mask optimization, and/or OPC.

For example, a prior art source mask optimization process is described in U.S. Pat. No. 9,588,438 titled "Optimization Flows of Source, Mask and Projection Optics", which is incorporated in its entirety by reference. This prior art source mask optimization process is performed for the center of a slit on a typical layout clip. The resulting optimization of the source and mask variables are considered representative of all positions on the slit (and/or other positions).

Optical proximity correction (OPC) enhances an integrated circuit patterning process by compensating for distortions that occur during processing. The distortions occur during processing because features printed on a wafer are smaller than the wavelengths of light used in the patterning and printing process. OPC verification identifies OPC errors or weak points in a post-OPC wafer design that could potentially lead to patterning defects on the wafer. ASML Tachyon Lithography Manufacturability Check (LMC) is an OPC verification product, for example.

OPC addresses the fact that the final size and placement of an image of the design layout projected on the substrate will not be identical to, or simply depend only on the size and placement of the design layout on the patterning device. In the context of resolution enhancement techniques (RET) such as OPC, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to increase the chance that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design, almost every feature of the design layout has some modification in order to achieve high fidelity of the projected image to the target design. These modifications may include shifting or biasing of edge positions or line widths as well as application of "assist" features that are intended to assist projection of other features.

One form of OPC is selective bias. Given a CD vs. pitch curve, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD versus pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other OPC techniques have been developed for application beyond the one-dimensional bias example above. A two-dimensional proximity effect is line end shortening. Line ends tend to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of integrated circuit design and manufacturing is to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the design layout. The terms "main feature" and "assist feature" do not imply that a particular feature on a patterning device must be labeled as one or the other.

As described above, typical source mask, or mask only, optimization operations (e.g., optical proximity correction) assume a flat and/or otherwise uniform illumination intensity profile to represent illumination from an illumination source. In contrast, the present method uses a non-uniform open slit illumination intensity profile as input for source mask, or mask only, optimization operations (e.g., such as optical proximity correction) and/or other operations. The present method also includes beam intercepting finger member (e.g., Unicom) corrected profiles as one of the inputs or constraints in the optimization operations (e.g., in optical proximity correction). In some embodiments, the present method may be thought of as using source mask, or mask only, optimization operations (e.g., such as optical proximity correction) to compensate for the non-uniformity of through (open) slit illumination from an illumination source.

The present method enhances imaging performance of lithographic apparatuses. This method may be beneficial for pupil settings such as dipole-x (DX), which is associated with high gradients at the edges of an open-slit, for example, and other pupil settings. Advantageously, the open-slit non-uniform illumination intensity profile used in the present method remains substantially consistent from lithographic apparatus to lithographic apparatus (e.g., scanner to scanner), with only a relatively small amount of variation over time (e.g., such as drift in an open-slit because of collector contamination, illuminator tolerances, etc.) In addition, the present method is configured to account for high frequency non-uniformity (residue) induced by the beam intercepting finger members.

Figure 3:
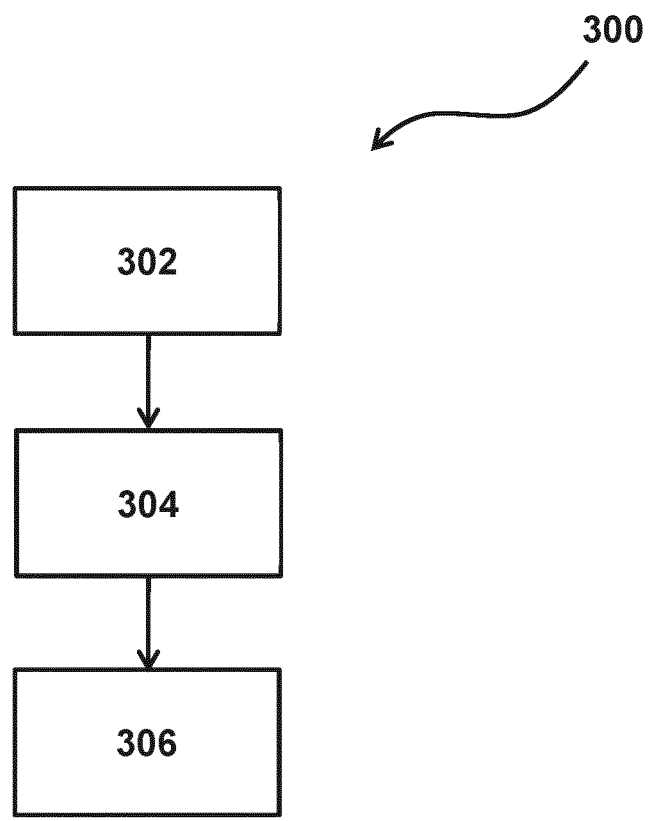
FIG. 3 illustrates an example of a present method for source mask, or mask only, optimization associated with a lithographic projection apparatus, according to an embodiment.

FIG. 3 illustrates an example of a present method 300 for source mask, or mask only, optimization associated with a lithographic projection apparatus. The optimization method may be associated with imaging a pattern onto a substrate with the lithographic projection apparatus, for example. The pattern may be a mask pattern and/or other patterns. Example method 300 shown in FIG. 3 includes determining 302 a non-uniform illumination intensity profile, adjusting 304 for drift in the non-uniform illumination intensity profile, determining 306 one or more adjustments for a pattern based on the non-uniform (and/or drift adjusted non-uniform) illumination intensity profile, and/or other operations. In some embodiments, the operations of method 300 (e.g., determining the non-uniform illumination intensity profile, adjusting for drift, determining the one or more adjustments, and/or other operations) are performed for a semiconductor manufacturing process.

The operations of method 300 presented below are intended to be illustrative. In some embodiments, method 300 may be accomplished with one or more additional operations not described, and/or without one or more of the operations discussed. Additionally, the order in which the operations of method 300 are illustrated in FIG. 3 and described below is not intended to be limiting.

In some embodiments, one or more portions of method 300 may be implemented (e.g., by simulation, modeling, etc.) in one or more processing devices. The one or more processing devices may include one or more devices executing some or all of the operations of method 300 in response to instructions stored electronically on an electronic storage medium. The one or more processing devices may include one or more devices configured through hardware, firmware, and/or software to be specifically designed for execution of one or more of the operations of method 300, for example.

Determining 302 the non-uniform illumination intensity profile may be for illumination from an illumination source. For example, a lithographic projection apparatus may comprise an illumination source and projection optics (among other components) configured to image a mask design layout onto a substrate. The illumination source may be a mercury lamp or excimer laser, a laser produced plasma EUV source, and/or other sources configured to produce a beam of radiation. The projection optics may comprise a pupil, a slit, and/or other components. The non-uniform illumination intensity profile is determined based on the illumination source and the projection optics. In some embodiments, the non-uniform illumination intensity profile is a through slit non-uniform illumination intensity profile, for example. Method 300 may use a non-uniform illumination intensity profile because such a profile (e.g., a profile associated with an open slit) may remain relatively constant from scanner to scanner (with some drift over time as described below), does not include (and/or includes a reduced amount of) the high frequency non-uniformity described herein, and/or for other reasons.

Figure 4A:
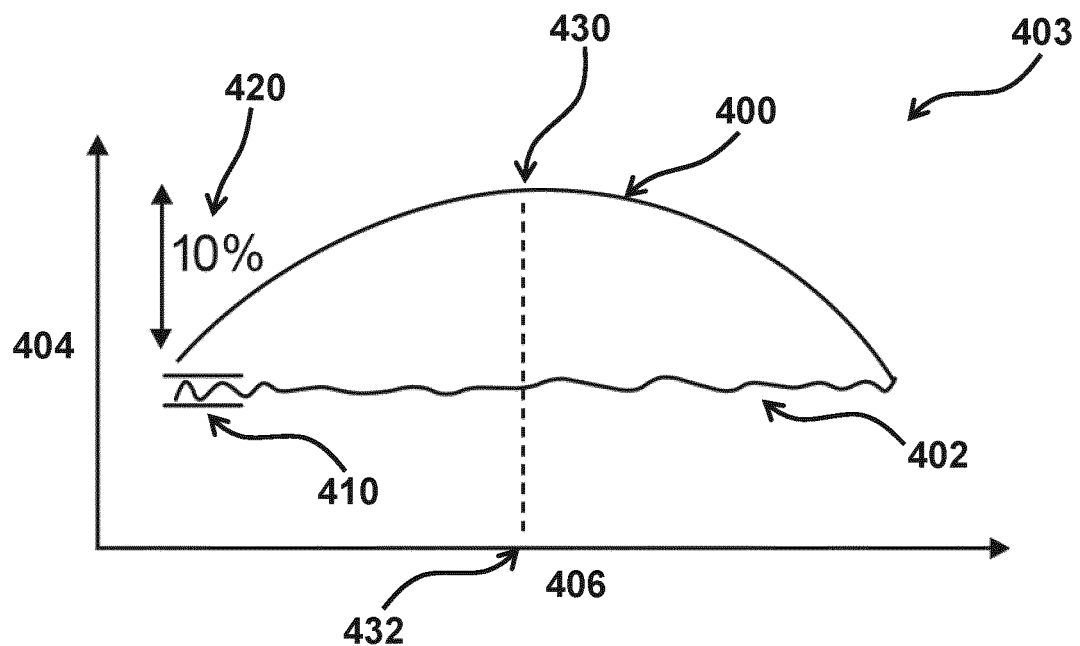
FIG. 4A illustrates an open slit non-uniform illumination intensity profile and a corrected illumination intensity profile, according to an embodiment.

By way of a non-limiting example, FIG. 4A illustrates an open slit non-uniform illumination intensity profile 400 and a corrected illumination intensity profile 402. Profiles 400 and 402 are shown on a plot 403 of intensity 404 versus slit position 406 (e.g., X in mm). As described above, typical source mask, or mask only, optimization operations (e.g., optical proximity correction) assume a flat and/or otherwise uniform illumination intensity profile such as profile 402 to represent illumination from an illumination source. Typical optimization operations (e.g., optical proximity correction) do not account for the non-uniform high frequency effects of beam intercepting (e.g., Unicom) finger members. In actual practice, these finger members are used to correct (or flatten) a non-uniform illumination intensity profile for illumination from an illumination source passing through an open slit (in a lithographic apparatus) such as profile 400. These finger members produce the flat and/or otherwise uniform corrected illumination intensity profile (e.g., profile 402) used (assumed) for typical optical proximity correction, for example. However, these finger members induce high frequency non-uniformity 410 in corrected illumination intensity profile 402. High frequency non-uniformity 410 may be enhanced for a pupil distribution such as a dipole-x pupil distribution (DX), with two lobes in a non-scan direction which correspond to a finger pitch and/or fingertip geometry of the fingers. The DX pupil has an increased high frequency non-uniformity 410 (e.g., relative to other pupil configurations) because the pitch of the finger members matches the distance between the lobes of the pupil in a typical process. High frequency non-uniformity 410 negatively impacts the imaging performance of a lithographic apparatus and is not accounted for by typical optimization operations including optical proximity correction (e.g., because flat and/or otherwise uniform corrected profile 402—without the high frequency non-uniformity—is simply assumed).

The present method (e.g., method 300 shown in FIG. 3) uses non-uniform open slit illumination intensity profile 400 as input for source mask, or mask only, optimization operations (e.g., such as optical proximity correction) and/or other operations. The present method uses profile 400 instead of profile 402 for these operations, for example. As shown in FIG. 4A, non-uniform open slit intensity profile 400 appears generally umbrella or dome shaped (this is not intended to be limiting), with a highest intensity 430 corresponding to a position 432 at or near the center of an open slit, and decreasing intensities toward the edges of an open slit. Intensity 404 of non-uniform open slit intensity profile 400 may vary 420 by as much as 10% or more at different positions 406 across an open slit, for example.

The present method also accounts for high frequency non-uniformity 410 by facilitating the inclusion of beam intercepting finger member (e.g., Unicom) corrected profiles as one of the inputs or constraints in the optimization operations (e.g., in optical proximity correction). This may include receiving data and/or measurements made on prior samples and/or models, receiving inputs and/or selections from a user via a user interface, and/or other facilitation. No high frequency non-uniformity is shown in profile 400 in FIG. 4A, for example. As described above, this method enhances imaging performance of lithographic apparatuses.

In some embodiments, non-uniform illumination intensity profile 400 is determined based on a population of empirical data and/or a corresponding electronic model for the illumination source and/or the projection optics. For example, profile 400 may be determined based on an optical model of the illuminator optics for the pupil-shape to be utilized, or based on a collection of measurements from a sensor that integrates a thin slice of the slit (in the scan direction) and moves across the slit to form a slit uniformity profile.

Returning to FIG. 3, method 300 includes adjusting 304 for drift. Drift may comprise undesired variation in the illumination intensity profile of the illumination from the illumination source. The drift may be caused by projection optics collector contamination, illumination source tolerances, and/or other factors that change over time. In some embodiments, adjusting for drift comprises positioning one or more beam interceptors (e.g., the Unicom fingers) in one or more locations in a path of the illumination from the illumination source to intercept one or more corresponding portions of the illumination in the one or more locations. In some embodiments, the one or more beam interceptors comprise one or more opaque finger members. In some embodiments, adjusting for drift comprises modeling a positioning of one or more beam interceptors in one or more locations in a path of the illumination from the illumination source to intercept one or more corresponding portions of the illumination in the one or more locations.

Figure 4B:
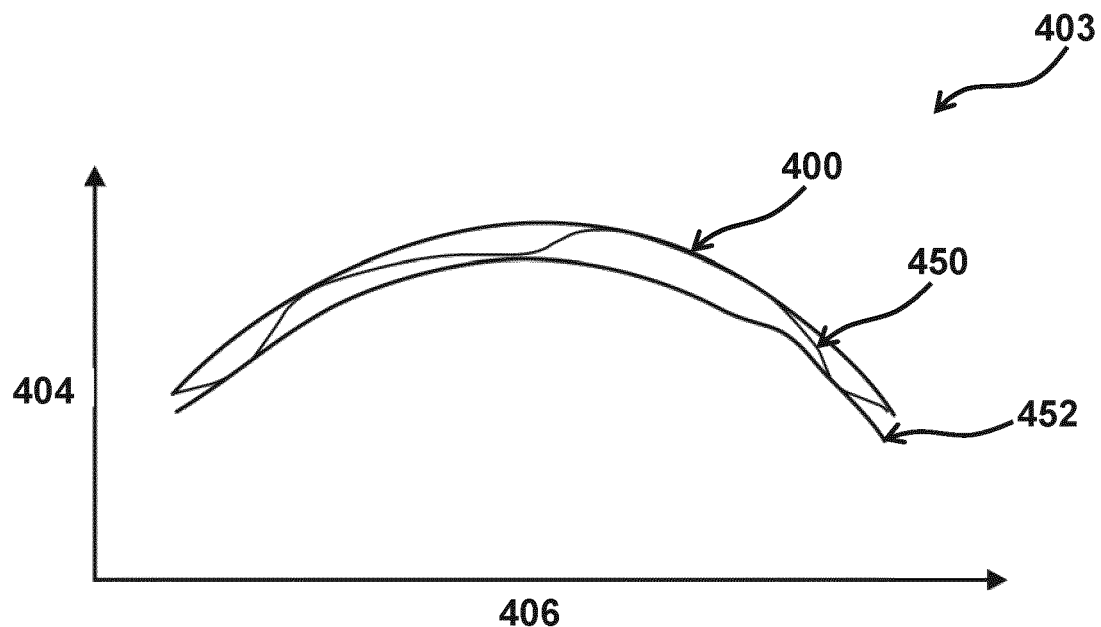
FIG. 4B illustrates drift in the open slit non-uniform illumination intensity profile shown in FIG. 4A, according to an embodiment.

By way of a non-limiting example, FIG. 4B illustrates drift in open slit non-uniform illumination intensity profile 400 shown in FIG. 4A. Profile 400 is again shown on plot 403 of intensity 404 versus slit position 406 (e.g., X in mm). Drift is shown by drifted profile 450 in plot 403. Drift may comprise undesired variation in open slit non-uniform illumination intensity profile 400, for example. The drift in profile 400 may be caused by projection optics collector contamination, illumination source tolerances, and/or other factors that change over time. In some embodiments, adjusting for drift comprises positioning (or modeling the positioning of) one or more beam interceptors (e.g., the Unicom fingers) in one or more locations in a path of the illumination from the illumination source to intercept one or more corresponding portions of the illumination in the one or more locations.

A drift adjusted non-uniform open slit illumination intensity profile 452 is also shown in FIG. 4B. As shown in FIG. 4B, drift adjusted non-uniform open slit illumination intensity profile 450 also appears generally umbrella or dome shaped (this is not intended to be limiting), with a highest intensity corresponding to a position at or near the center of an open slit, and decreasing intensities toward the edges of an open slit. In some embodiments, the present method uses profile 452 instead of profile 400 for source mask, or mask only, optimization, for example. As described above, this method may enhance imaging performance of lithographic apparatuses, and/or has other advantages.

Returning to FIG. 3, method 300 includes determining 306 one or more adjustments for a pattern based on the non-uniform (and/or drift adjusted non-uniform) illumination intensity profile. In some embodiments, operation 306 includes determining one or more adjustments for the pattern, the projection optics, the illumination source, and/or other components. Operation 306 includes adjusting the pattern, the projection optics, the illumination source, and/or the other components based on the non-uniform illumination intensity profile (e.g., determined based on the illumination source and/or projection optics as described above). The pattern, the projection optics, the illumination source, and/or the other components may be adjusted until a termination condition is satisfied, for example. In some embodiments, the termination condition comprises a determination that features patterned onto the substrate substantially match a target design. Put another way, the pattern, the projection optics, the illumination source, and/or the other components may be adjusted until the dimensions, locations, and/or other properties of features patterned into a substrate (e.g., physically patterned and/or modeled) are within design tolerances for those dimension, locations, and/or other properties.

For example, determining the one or more adjustments for one or more of the pattern, the projection optics, or the illumination source may comprise determining an adjustment for a through slit pupil. The through slit pupil may be adjusted until the features of the pattern substantially match a target design. In some embodiments, the projection optics may comprise a dipole-x pupil, and determining the one or more adjustments for one or more of the pattern, the projection optics, the illumination source, and/or other components comprises determining an adjustment for a through slit dipole-x pupil. The dipole-x pupil setting may be associated with relatively high gradients at the edges of an open slit, for example. (Although such gradients may be corrected by the beam interceptors described above (such as 4 mm pitch fingers), high frequency residue in a corrected beam may still remain.)

In some embodiments, determining the one or more adjustments for one or more of the pattern, the projection optics, the illumination source, and/or other components based on the non-uniform illumination intensity profile and/or other information is configured to reduce effects from high frequency non-uniformity in the illumination from the illumination source relative to illumination from the illumination source having a substantially uniform illumination intensity profile (e.g., see 410 in FIG. 4A). This may enhance imaging by a lithographic apparatus and/or have other advantages. For example, non-uniformity in the illuminator slit will create localized areal image variations at the wafer leading to contrast changes. This will cause localized dose variations in the resist that will create critical dimension changes in the printed features.

In some embodiments, adjustments may be iterative adjustments of the pattern, parameters of the illumination source, parameters of the projection optics, and/or other iterative adjustments, for example. The iterative adjustments may continue until the termination condition is satisfied (e.g., until one or more features patterned on a substrate adequately match a target design). In some embodiments, adjustments of the pattern include adjustments of design variables (e.g., feature dimensions, locations, etc.; adding and/or subtracting assist features; etc.). Adjustments of the parameters of the illumination source include adjustments of a dose, a wavelength, an intensity, and/or other parameters of the illumination. Adjustments of the parameters of the projection optics may include pupil adjustments, adjusting a slit, and/or other parameters of the projection optics.

In some embodiments, the iterative adjustment of the pattern, parameters of the illumination source, parameters of the projection optics, and/or other iterative adjustments until a termination condition is satisfied is performed without constraints restricting ranges of possible values of the tunable variables. In some embodiments, the iterative adjustment of the pattern, parameters of the illumination source, parameters of the projection optics, and/or other iterative adjustments until a termination condition is satisfied is performed with at least one constraint restricting a range of possible values of at least one tunable variable. In some embodiments, the at least one constraint is associated with one or more of physical characteristics of the lithographic projection apparatus, dependence of a design variable on one or more other design variables, or mask manufacturability. (For example, the at least one constraint may be associated with a Unicom corrected illumination intensity profile.) In some embodiments, iteratively adjusting the pattern, parameters of the illumination source, parameters of the projection optics, and/or other iterative adjustments comprises repeatedly changing a value of the at least one tunable variable within the restricted range of possible values until the termination condition is satisfied. Possible ranges of variables include ranges for pupil parameters such as pupil inner (>0) and outer sigma (<1), pupil spot distribution in the pupil plane (e.g. density between 0 and 1 in a certain sigma range), pupil intensity distribution in the pupil plane (e.g. between 0 and 1 of the normalized pupil spot intensity distribution), and mask variables such as a bias (between 0 and X nm) or a shape (e.g. angle with respect to X, Y between and Y degrees) of critical features thru-slit. Other examples are contemplated.

In some embodiments, determining the one or more adjustments for one or more of the pattern, the projection optics, or the illumination source comprises determining a through slit apodization. The transmission variation of the projection optics as a function of the pupil & field coordinates $T(x,y,\varphi,\theta)$ is known as the apodization, and leads to imaging-structure dependent dose effects, that impacts predominantly the CD performance, also known as proximity effects.

In some embodiments, determining the one or more adjustments for one or more of the pattern, the projection optics, or the illumination source comprises performing optical proximity correction. Performing optical proximity correction may comprise applying one or more rule or model based assist features, and modeling a process for imaging the pattern onto the substrate, for example. In some embodiments, a model comprises a through slit optical proximity correction model configured to model the process for imaging the pattern onto the substrate using the non-uniform illumination intensity profile. In some embodiments, the through slit optical proximity correction model is configured to model the process for imaging the pattern onto the substrate using the non-uniform illumination intensity profile and different doses from the illumination source.

In some embodiments, the non-uniform illumination intensity profile is used for a pupil and mask co-optimization step of source mask optimization, mask only optimization, and/or in other applications for a semiconductor manufacturing process. This may include performing optical proximity correction, for example, and/or other operations.

Figure 5:
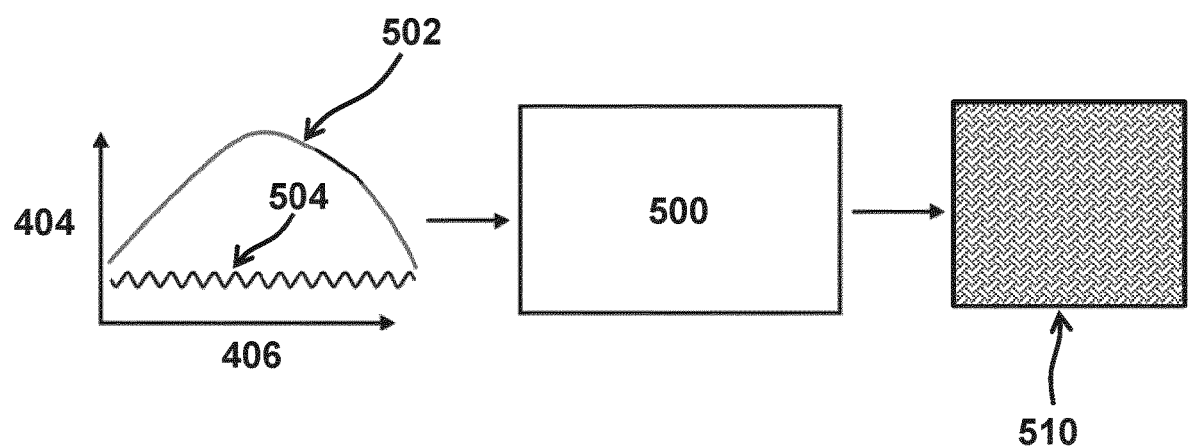
FIG. 5 illustrates performing optical proximity correction based on an (e.g., drift adjusted or non-drift adjusted) open slit non-uniform illumination intensity profile, according to an embodiment.

By way of a non-limiting example, FIG. 5 illustrates performing optical proximity correction 500 based on an (e.g., drift adjusted or non-drift adjusted) open slit non-uniform illumination intensity profile 502. In some embodiments, as shown in FIG. 5, optical proximity correction 500 may be performed based on profile 502 and/or a corrected (e.g., flattened) illumination intensity profile 504. In some embodiments, optical proximity correction 500 (e.g., based on profile 502) may facilitate one or more adjustments in a pattern such as a mask pattern 510 based on the non-uniform (and/or drift adjusted non-uniform) illumination intensity profile. In some embodiments, optical proximity correction 500 may facilitate determining one or more adjustments for pattern 510, projection optics, an illumination source, and/or other components. In this example, pattern 510 may be iteratively adjusted based on output from optical proximity correction 500 until a determination that features patterned onto the substrate substantially match a target design in pattern 510.

Figure 6:
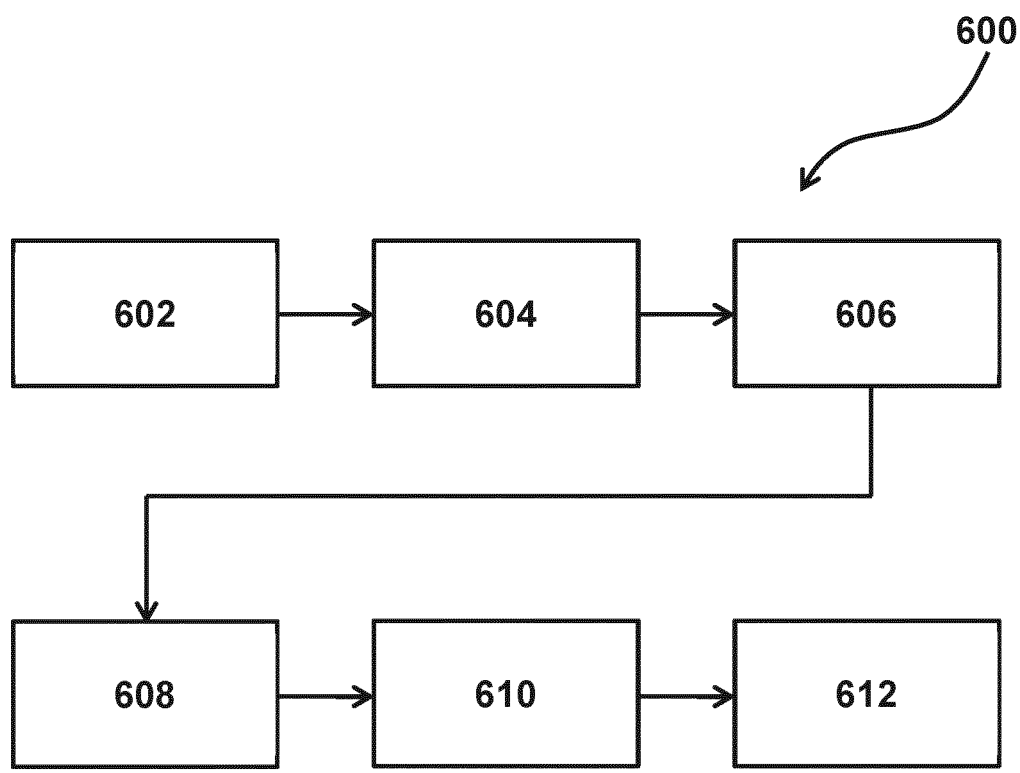
FIG. 6 illustrates pupil and mask co-optimization operations performed based on an open slit non-uniform illumination intensity profile, according to an embodiment.

By way of another non-limiting example, FIG. 6 illustrates pupil and mask co-optimization operations 600. One or more operations 600 may be performed based on an open slit non-uniform illumination intensity profile and/or other information. In some embodiments, operations 600 may include obtaining and/or otherwise receiving 602 an input lithography model, performing (e.g., simulating) a mask defocus optimization operation 604, performing (e.g., simulating) a continuous freeform pupil and mask co-optimization (including Unicom corrections for high frequency non-uniformity and/or drift) 606, performing (e.g., simulating) a discrete flex pupil and mask co-optimization (including Unicom corrections for high frequency non-uniformity and/or drift) 608, performing (e.g., simulating) a final flex pupil and mask co-optimization 610, performing (e.g., simulating) a machine specific pupil qualification and scanner connectivity verification 612, and/or other operations. In this example, operations 604, 606, 608, 610, and/or other operations may be performed based on the open slit non-uniform illumination intensity profile, for example.

Figure 7:
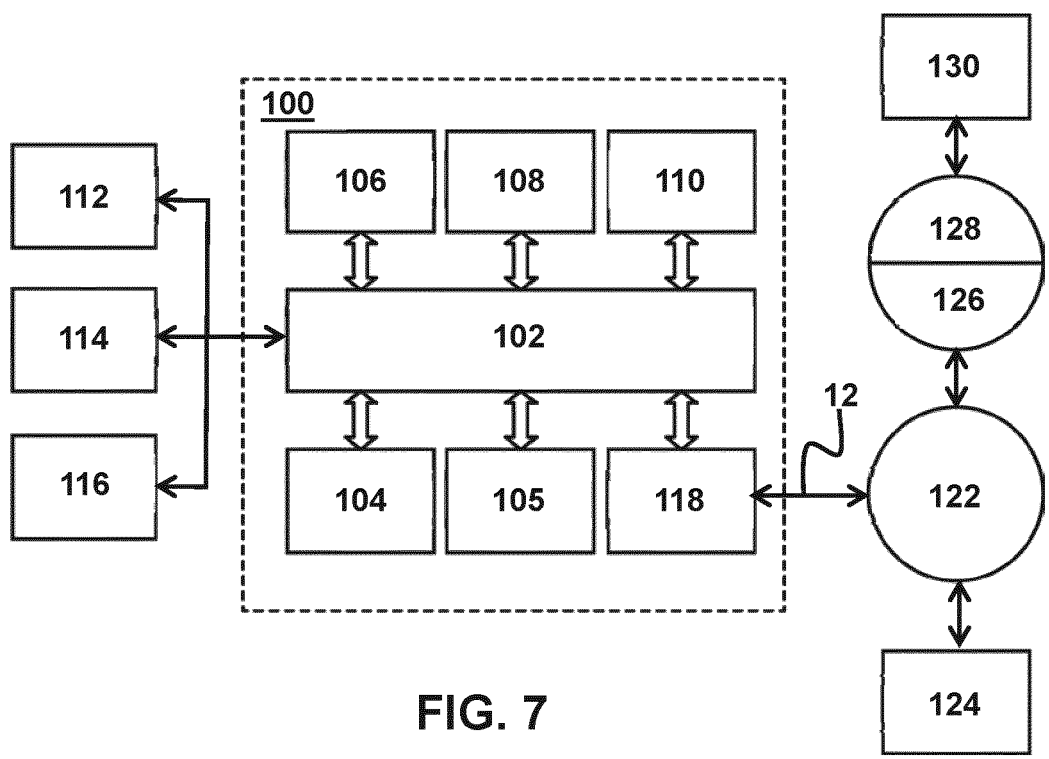
FIG. 7 is a block diagram of an example computer system, according to an embodiment.

FIG. 7 is a block diagram that illustrates a computer system 100 that can assist in implementing the methods, flows, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer (e.g., a server and/or other computing devices), a solid-state storage device, and/or in other locations. The remote computer can load the instructions into its dynamic memory and send the instructions over a wireless communication network (e.g., the internet, a cellular communications network, etc.), through a telephone line using a modem, and/or by other methods. A modem and/or other data receiving components local to computer system 100 can receive the data via the wireless communication network, on the telephone line, etc., and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such embodiment, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 8:
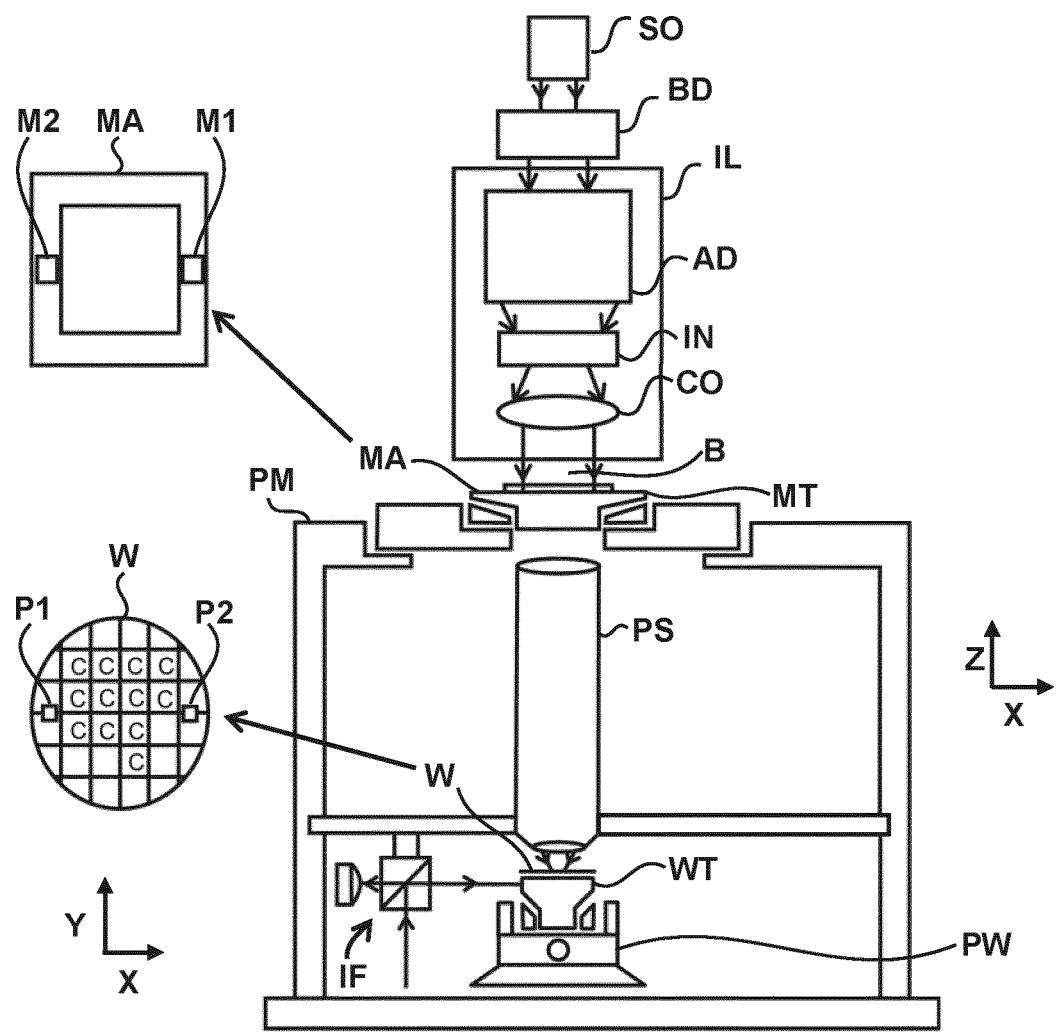
FIG. 8 is a schematic diagram of a lithographic projection apparatus, according to an embodiment.

FIG. 8 is a schematic diagram of a lithographic projection apparatus, according to an embodiment. The lithographic projection apparatus can include an illumination system IL, a first object table MT, a second object table WT, and a projection system PS. Illumination system IL can condition a beam B of radiation. In this example, the illumination system also comprises a radiation source SO. First object table (e.g., a patterning device table) MT can be provided with a patterning device holder to hold a patterning device MA (e.g., a reticle), and connected to a first positioner to accurately position the patterning device with respect to item PS. Second object table (e.g., a substrate table) WT can be provided with a substrate holder to hold a substrate W (e.g., a resist-coated silicon wafer), and connected to a second positioner to accurately position the substrate with respect to item PS. Projection system (e.g., which includes a lens) PS (e.g., a refractive, catoptric or catadioptric optical system) can image an irradiated portion of the patterning device MA onto a target portion C (e.g., comprising one or more dies) of the substrate W. Patterning device MA and substrate W may be aligned using patterning device alignment marks M1, M2 and substrate alignment marks P1, P2, for example.

As depicted, the apparatus can be of a transmissive type (i.e., has a transmissive patterning device). However, in general, it may also be of a reflective type, for example (with a reflective patterning device). The apparatus may employ a different kind of patterning device for a classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander, or beam delivery system BD (comprising directing mirrors, the beam expander, etc.). for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus. The radiation beam that it produces may be led into the apparatus (e.g., with the aid of suitable directing mirrors), for example. This latter scenario can be the case when source SO is an excimer laser (e.g., based on KrF, ArF or F2 lasing), for example.

The beam B can subsequently intercept patterning device MA, which is held on a patterning device table MT. Having traversed patterning device MA, the beam B can pass through the lens, which focuses beam B onto target portion C of substrate W. With the aid of the second positioning means (and interferometric measuring means IF), the substrate table WT can be moved accurately, e.g. to position different target portions C in the path of beam B. Similarly, the first positioning means can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool), patterning device table MT may be connected to a short stroke actuator, or may be fixed.

The depicted tool can be used in two different modes, step mode and scan mode. In step mode, patterning device table MT is kept essentially stationary, and an entire patterning device image is projected in one operation (i.e., a single "flash") onto a target portion C. Substrate table WT can be shifted in the x and/or y directions so that a different target portion C can be irradiated by beam B. In scan mode, essentially the same scenario applies, except that a given target portion C is not exposed in a single "flash." Instead, patterning device table MT is movable in a given direction (e.g., the "scan direction", or the "y" direction) with a speed v, so that projection beam B is caused to scan over a patterning device image. Concurrently, substrate table WT is simultaneously moved in the same or opposite direction at a speed V=Mv, in which M is the magnification of the lens (typically, M=¼ or ⅕). In this manner, a relatively large target portion C can be exposed, without having to compromise on resolution.

Figure 9:
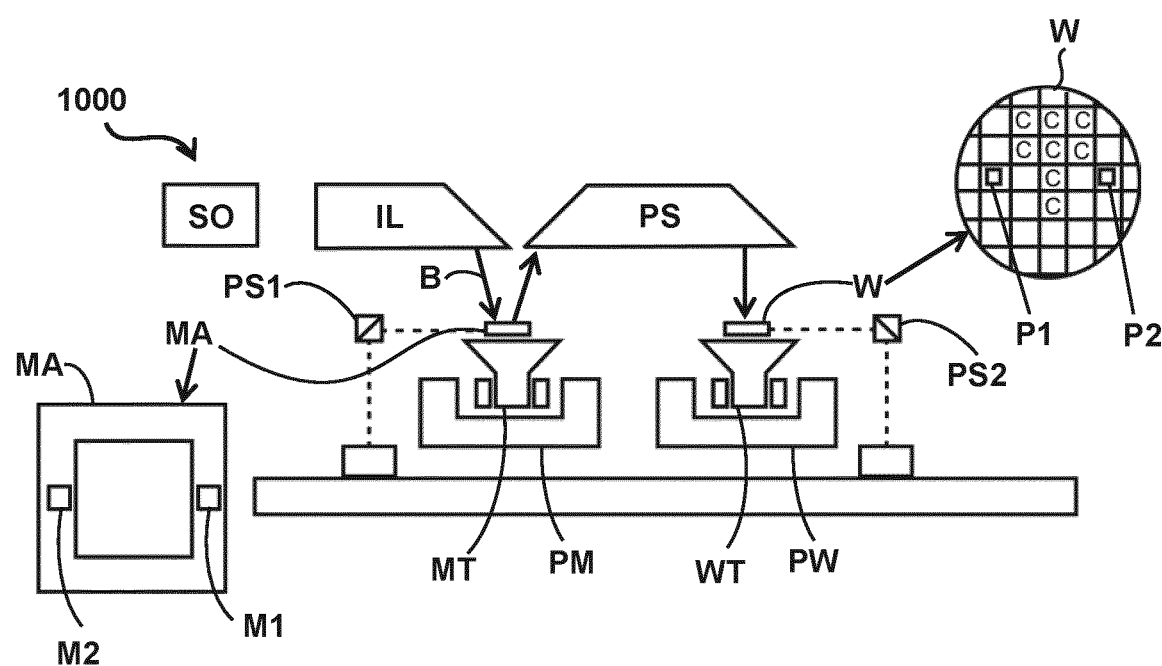
FIG. 9 is a schematic diagram of another lithographic projection apparatus, according to an embodiment.

FIG. 9 is a schematic diagram of another lithographic projection apparatus 1000. Apparatus 1000 can include source collector module SO, illumination system (illuminator) IL configured to condition a radiation beam B (e.g. EUV radiation), support structure MT, substrate table WT, and projection system PS. Support structure (e.g. a patterning device table) MT can be constructed to support a patterning device (e.g. a mask or a reticle) MA and connected to a first positioner PM configured to accurately position the patterning device. Substrate table (e.g. a wafer table) WT can be constructed to hold a substrate (e.g. a resist coated wafer) W and connected to a second positioner PW configured to accurately position the substrate. Projection system (e.g. a reflective projection system) PS can be configured to project a pattern imparted to the radiation beam B by patterning device MA onto a target portion C (e.g. comprising one or more dies) of the substrate W.

As shown in this example, apparatus 1000 can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP"), the plasma can be produced by irradiating a fuel, such as a droplet, stream or cluster of material having the line-emitting element, with a laser beam. Source collector module SO may be part of an EUV radiation system including a laser (not shown in FIG. 9), for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation. In this example, the laser may not be considered to form part of the lithographic apparatus and the radiation beam can be passed from the laser to the source collector module with the aid of a beam delivery system comprising, for example, suitable directing mirrors and/or a beam expander. In other examples, the source may be an integral part of the source collector module, for example when the source is a discharge produced plasma EUV generator, often termed a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder, or capacitive sensor), the substrate table WT can be moved accurately (e.g. to position different target portions C in the path of radiation beam B). Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus may be used in at least one of the following modes, step mode, scan mode, and stationary mode. In step mode, the support structure (e.g. patterning device table) MT and the substrate table WT are kept essentially stationary, while an entire pattern imparted to the radiation beam is projected onto a target portion C at one time (e.g., a single static exposure). The substrate table WT is then shifted in the X and/or Y direction so that a different target portion C can be exposed. In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de)magnification and image reversal characteristics of the projection system PS. In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
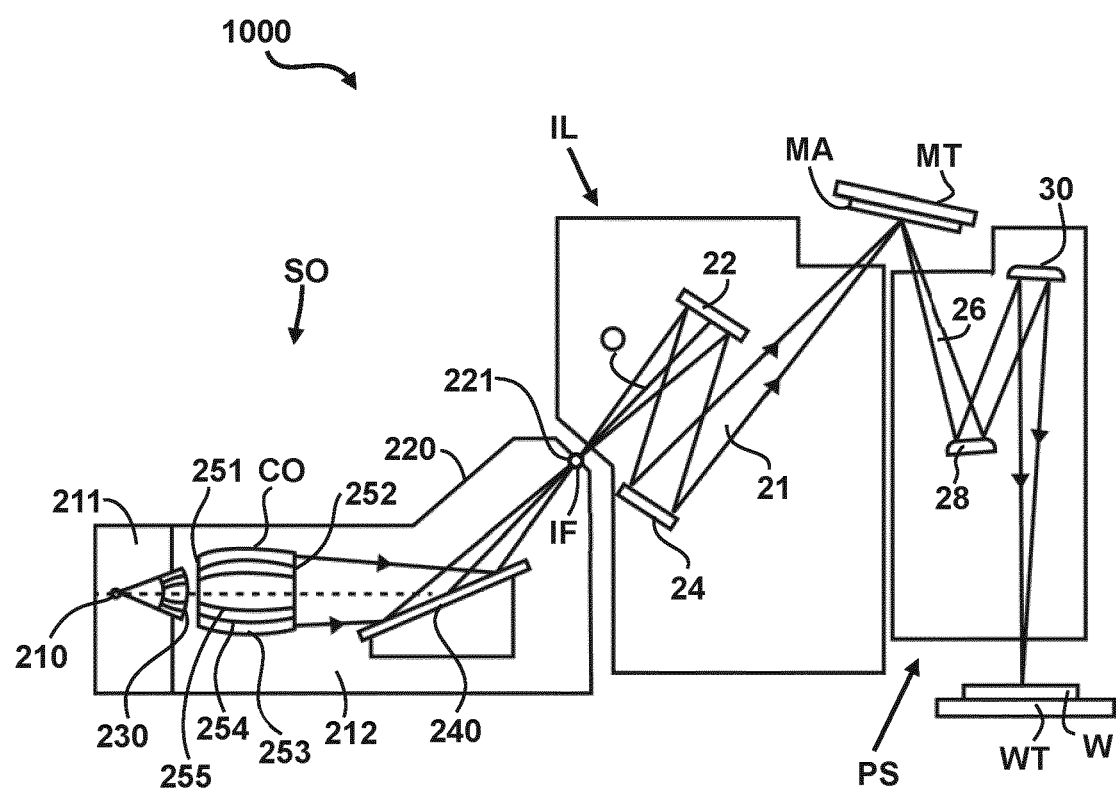
FIG. 10 is a more detailed view of the apparatus in FIG. 9, according to an embodiment.

FIG. 10 shows the apparatus 1000 in more detail, including the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source (and/or other sources as described above). EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-10 or more additional reflective elements present in the projection system PS than shown in FIG. 10.

Collector optic CO, as further illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 11:
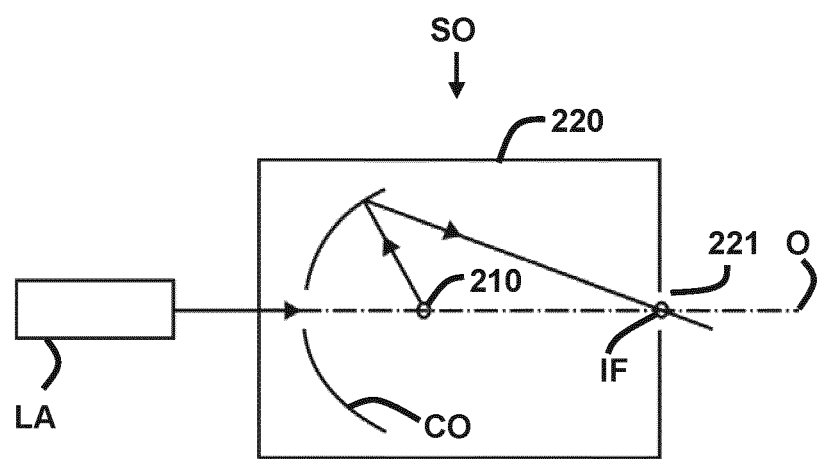
FIG. 11 is a more detailed view of the source collector module of the apparatus of FIG. 9 and FIG. 10, according to an embodiment.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Other aspects of the invention are set out as in the following numbered clauses.

1. An optimization method associated with imaging a pattern, the method comprising:
   determining a non-uniform illumination intensity profile for illumination from an illumination source; and
   adjusting the pattern based on the non-uniform illumination intensity profile until a termination condition is satisfied.

2. The method of clause 1, wherein the determining and adjusting are performed as part of source mask optimization or mask only optimization.

3. The method of clause 1 or 2, wherein the non-uniform illumination intensity profile is determined based on a population of empirical data and/or a corresponding electronic model.

4. The method of any of clauses 1-3, wherein the method is for a lithographic apparatus, the lithographic apparatus comprising the illumination source and projection optics configured to image the pattern onto a substrate;
   wherein the non-uniform illumination intensity profile is determined based on the illumination source and the projection optics; and
   wherein the method further comprises determining one or more adjustments for one or more of the pattern, the projection optics, or the illumination source based on the non-uniform illumination intensity profile until the termination condition is satisfied.

5. The method of clause 4, wherein projection optics comprise a slit, and wherein the non-uniform illumination intensity profile is a through slit non-uniform illumination intensity profile.

6. The method of clause 5, wherein the projection optics comprise a pupil, and wherein determining the one or more adjustments for one or more of the pattern, the projection optics, or the illumination source comprises determining an adjustment for a through slit pupil.

7. The method of any of clauses 4-6, wherein determining the one or more adjustments for one or more of the pattern, the projection optics, or the illumination source comprises determining a through slit apodization.

8. The method of any of clauses 4-7, wherein determining the one or more adjustments for one or more of the pattern, the projection optics, or the illumination source comprises performing optical proximity correction.

9. The method of clause 8, wherein performing optical proximity correction comprises applying one or more rule or model based assist features, and modeling a process for imaging the pattern onto the substrate.

10. The method of clause 9, wherein a model comprises a through slit optical proximity correction model configured to model the process for imaging the pattern onto the substrate using the non-uniform illumination intensity profile.

11. The method of clause 10, wherein the through slit optical proximity correction model is configured to model the process for imaging the pattern onto the substrate using the non-uniform illumination intensity profile and different doses from the illumination source.

12. The method of any of clauses 4-11, further comprising adjusting for drift in the non-uniform illumination intensity profile; and
   determining the one or more adjustments for one or more of the pattern, the projection optics, or the illumination source based on a drift-adjusted non-uniform illumination intensity profile until the termination condition is satisfied.

13. The method of clause 12, wherein adjusting for drift comprises positioning one or more beam interceptors in one or more locations in a path of the illumination from the illumination source to intercept one or more corresponding portions of the illumination in the one or more locations.

14. The method of clause 12, wherein the one or more beam interceptors comprise one or more opaque finger members.

15. The method of clause 12, wherein adjusting for drift comprises modeling a positioning of one or more beam interceptors in one or more locations in a path of the illumination from the illumination source to intercept one or more corresponding portions of the illumination in the one or more locations.

16. The method of any of clauses 12-15, wherein the drift is caused by one or both of projection optics collector contamination and illumination source tolerances.

17. The method of any of clauses 4-16, wherein determining the one or more adjustments for one or more of the pattern, the projection optics, or the illumination source based on the non-uniform illumination intensity profile is configured to reduce high frequency non-uniformity in the illumination from the illumination source relative to illumination from the illumination source having a substantially uniform illumination intensity profile.

18. The method of any of clauses 4-17, wherein the projection optics comprise a dipole X pupil, and wherein determining the one or more adjustments for one or more of the pattern, the projection optics, or the illumination source comprises determining an adjustment for a through slit dipole X pupil.

19. The method of any of clauses 4-18, wherein the determining the non-uniform illumination intensity profile and determining the one or more adjustments for one or more of the pattern, the projection optics, or the illumination source are performed for a semiconductor manufacturing process.

20. The method of clause 19, wherein the non-uniform illumination intensity profile is used for a pupil and mask co-optimization step of source mask optimization or mask only optimization for the semiconductor manufacturing process.

21. The method of any of clauses 1-20, wherein the pattern comprises a mask pattern.

22. The method of any of clauses 1-21, wherein the termination condition comprises a determination that features patterned onto the substrate substantially match a target design.

23. A non-transitory computer readable medium having instructions thereon, the instructions when executed by a computer implementing the method of any of clauses 1-22.

24. A non-transitory computer readable medium having instructions thereon, the instructions when executed by a computer causing the computer to:
   determine a non-uniform illumination intensity profile for illumination from an illumination source; and
   adjust the pattern based on the non-uniform illumination intensity profile until a termination condition is satisfied.

25. The medium of clause 24, wherein the determining and adjusting are performed as part of a source mask optimization or mask only optimization.

26. The medium of clause 24 or 25, wherein the non-uniform illumination intensity profile is determined based on a population of empirical data and/or a corresponding electronic model.

27. The medium of any of clauses 24-26, wherein the determining and adjusting are performed for a lithographic apparatus, the lithographic apparatus comprising the illumination source and projection optics configured to image the pattern onto a substrate;
   wherein the non-uniform illumination intensity profile is determined based on the illumination source and the projection optics; and
   wherein the instructions are further configured to cause the computer to determine one or more adjustments for one or more of the pattern, the projection optics, or the illumination source based on the non-uniform illumination intensity profile until the termination condition is satisfied.

28. The medium of clause 27, wherein projection optics comprise a slit, and wherein the non-uniform illumination profile is a through slit non-uniform illumination intensity profile.

29. The medium of clause 28, wherein the projection optics comprise a pupil, and wherein determining the one or more adjustments for one or more of the pattern, the projection optics, or the illumination source comprises determining an adjustment for a through slit pupil.

30. The medium of any of clause 27-29, wherein determining the one or more adjustments for one or more of the pattern, the projection optics, or the illumination source comprises determining a through slit apodization.

31. The medium of any of clause 27-30, wherein determining the one or more adjustments for one or more of the pattern, the projection optics, or the illumination source comprises performing optical proximity correction.

32. The medium of clause 31, wherein performing optical proximity correction comprises applying one or more rule or model based assist features, and modeling a process for imaging the pattern onto the substrate.

33. The medium of clause 32, wherein a model comprises a through slit optical proximity correction model configured to model the process for imaging the pattern onto the substrate using the non-uniform illumination intensity profile.

34. The medium of clause 33, wherein the through slit optical proximity correction model is configured to model the process for imaging the pattern onto the substrate using the non-uniform illumination intensity profile and different doses from the illumination source.

35. An optimization method associated with imaging a pattern, the method comprising:
   determining a non-uniform illumination intensity profile for illumination from an illumination source;
   adjusting the pattern based on the non-uniform illumination intensity profile until a termination condition is satisfied; and
   imaging the adjusted pattern onto a substrate.

36. A lithography apparatus, the apparatus comprising:
   an illumination source and projection optics configured to image a pattern onto a substrate; and
   one or more processors configured by machine readable instructions to:
      determine a non-uniform illumination intensity profile for illumination from the illumination source, the non-uniform illumination intensity profile determined based on the illumination source and the projection optics; and
      adjust the pattern based on the non-uniform illumination intensity profile until a termination condition is satisfied.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers. In addition, the combination and sub-combinations of disclosed elements may comprise separate embodiments. For example, the drift adjustment operation described herein may comprise its own separate embodiment, or it may be included with one or more other embodiments described herein.

The descriptions above are intended to be illustrative, not limiting. Thus, it will be apparent to one skilled in the art that modifications may be made as described without departing from the scope of the claims set out below.

The invention claimed is:

1. A method associated with imaging a pattern, the method comprising:
   determining a non-uniform illumination intensity profile for illumination from an illumination optical system; and
   adjusting, by a hardware computer system, the pattern and the illumination based on the non-uniform illumination intensity profile until a termination condition is satisfied.

2. The method of claim 1, wherein the determining and adjusting are performed as part of a source mask optimization.

3. The method of claim 1, wherein the non-uniform illumination intensity profile is determined based on a population of empirical data and/or a corresponding electronic model.

4. The method of claim 1, wherein the method is for a lithographic apparatus, the lithographic apparatus comprising the illumination optical system and projection optics configured to image the pattern onto a substrate;
   wherein the non-uniform illumination intensity profile is determined based on the illumination optical system and the projection optics; and
   wherein the method further comprises determining one or more adjustments for the projection optics based on the non-uniform illumination intensity profile until the termination condition is satisfied.

5. The method of claim 4, wherein the lithographic apparatus comprises a slit, and wherein the non-uniform illumination intensity profile is a through slit non-uniform illumination intensity profile.

6. The method of claim 5, wherein the lithographic apparatus comprises a pupil, and wherein the determining the one or more adjustments for one or more selected from: the pattern, the projection optics, or the illumination optical system comprises determining an adjustment for a through slit pupil.

7. The method of claim 4, wherein the determining the one or more adjustments for one or more selected from: the pattern, the projection optics, or the illumination optical system comprises determining a through slit apodization.

8. The method of claim 4, wherein determining the one or more adjustments for one or more selected from: the pattern, the projection optics, or the illumination optical system comprises performing optical proximity correction.

9. The method of claim 8, wherein the performing optical proximity correction comprises applying one or more rule or model based assist features, and modeling a process for imaging the pattern onto the substrate.

10. The method of claim 9, wherein a model for the modeling comprises a through slit optical proximity correction model configured to model the process for imaging the pattern onto the substrate using the non-uniform illumination intensity profile.

11. The method of claim 10, wherein the through slit optical proximity correction model is configured to model the process for imaging the pattern onto the substrate using the non-uniform illumination intensity profile and different doses from the illumination optical system.

12. The method of claim 4, further comprising adjusting for drift in the non-uniform illumination intensity profile; and
   the determining the one or more adjustments for one or more selected from: the pattern, the projection optics, or the illumination optical system is based on a drift-adjusted non-uniform illumination intensity profile until the termination condition is satisfied.

13. The method of claim 12, wherein the adjusting for drift comprises positioning one or more beam interceptors in one or more locations in a path of the illumination to intercept one or more corresponding portions of the illumination in the one or more locations.

14. The method of claim 12, wherein the adjusting for drift comprises modeling a positioning of one or more beam interceptors in one or more locations in a path of the illumination to intercept one or more corresponding portions of the illumination in the one or more locations.

15. The method of claim 12, wherein the drift is caused by projection optics collector contamination and/or illumination optical system tolerances.

16. The method of claim 4, wherein the determining the one or more adjustments for one or more selected from: the pattern, the projection optics, or the illumination optical system based on the non-uniform illumination intensity profile is configured to reduce high frequency non-uniformity in the illumination from the illumination optical system relative to illumination from the illumination optical system having a substantially uniform illumination intensity profile.

17. The method of claim 4, wherein the determining the one or more adjustments for one or more selected from: the pattern, the projection optics, or the illumination optical system comprises determining an adjustment for a through slit dipole X pupil.

18. The method of claim 4, wherein the determining the one or more adjustments for one or more selected from: the pattern, the projection optics, or the illumination optical system are performed for a semiconductor manufacturing process.

19. The method of claim 18, wherein the non-uniform illumination intensity profile is used for a pupil and mask co-optimization step of a source mask optimization for the semiconductor manufacturing process.

20. A computer program product comprising a non-transitory computer-readable medium having instructions therein, the instructions, when executed by a computer system, configured to cause the computer system to at least:
   determine a non-uniform illumination intensity profile for illumination from an illumination optical system; and
   adjust a pattern for imaging with the illumination and the illumination, based on the non-uniform illumination intensity profile until a termination condition is satisfied.

* * * * *